(12) United States Patent
Kutlu

(10) Patent No.: US 6,472,762 B1
(45) Date of Patent: Oct. 29, 2002

(54) ENHANCED LAMINATE FLIPCHIP PACKAGE USING A HIGH CTE HEATSPREADER

(75) Inventor: Zafer S. Kutlu, Menlo Park, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/944,964

(22) Filed: Aug. 31, 2001

(51) Int. Cl.[7] .............................................. H01L 23/52
(52) U.S. Cl. ..................... 257/778; 257/712; 257/713; 257/706; 257/707; 257/720; 257/796
(58) Field of Search ................. 257/712, 675, 257/778, 713, 706, 707, 710, 717, 720, 737, 738, 734, 796

(56) References Cited

U.S. PATENT DOCUMENTS

| 5,376,588 | A | | 12/1994 | Pendse |
| 5,696,027 | A | | 12/1997 | Crane, Jr. |
| 5,811,317 | A | * | 9/1998 | Maheshwari et al. ......... 29/827 |
| 5,866,943 | A | * | 2/1999 | Mertol ........................ 257/659 |
| 5,952,726 | A | | 9/1999 | Liang |
| 6,015,722 | A | * | 1/2000 | Banks et al. ................. 438/108 |
| 6,048,753 | A | | 4/2000 | Farnworth |
| 6,053,394 | A | * | 4/2000 | Dockerty et al. ....... 228/180.22 |
| 6,064,113 | A | | 5/2000 | Kirkman |
| 6,111,313 | A | * | 8/2000 | Kutlu .......................... 257/697 |
| 6,111,756 | A | | 8/2000 | Moresco |
| 6,114,761 | A | * | 9/2000 | Mertol et al. ................ 257/706 |
| 6,198,635 | B1 | | 3/2001 | Shenoy et al. |
| 6,201,301 | B1 | * | 3/2001 | Hoang ......................... 257/712 |
| 6,236,568 | B1 | * | 5/2001 | Lai et al. ...................... 165/80.3 |
| 6,250,127 | B1 | * | 6/2001 | Polese et al. .................. 72/256 |
| 6,323,066 | B2 | * | 11/2001 | Lai et al. ..................... 438/122 |
| 2001/0008776 | A1 | * | 7/2001 | Lai et al. ..................... 438/106 |

* cited by examiner

Primary Examiner—Nathan J. Flynn
Assistant Examiner—Pershelle Greene
(74) Attorney, Agent, or Firm—Christopher P. Maiorana, P.C.

(57) ABSTRACT

A flipchip packaged integrated circuit comprising a substrate, a die and a heatspreader. The die may be configured to electrically attach to the substrate. The heat spreader may be rigidly attached to the die. The die and the heatspreader may have a combined coefficient of thermal expansion when attached. The heatspreader may be configured to match the combined coefficient of thermal expansion and a coefficient of thermal expansion of the substrate.

20 Claims, 6 Drawing Sheets

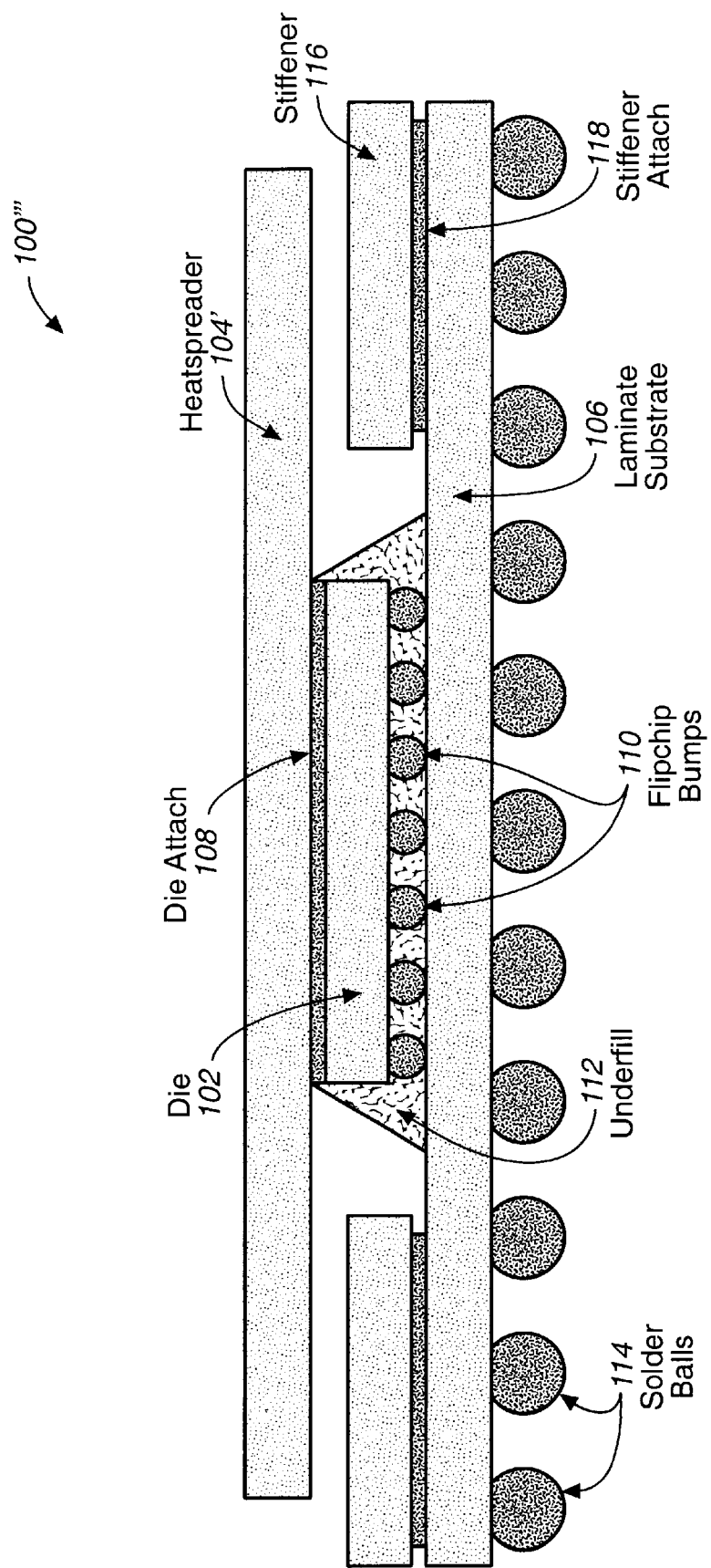
FIG._5

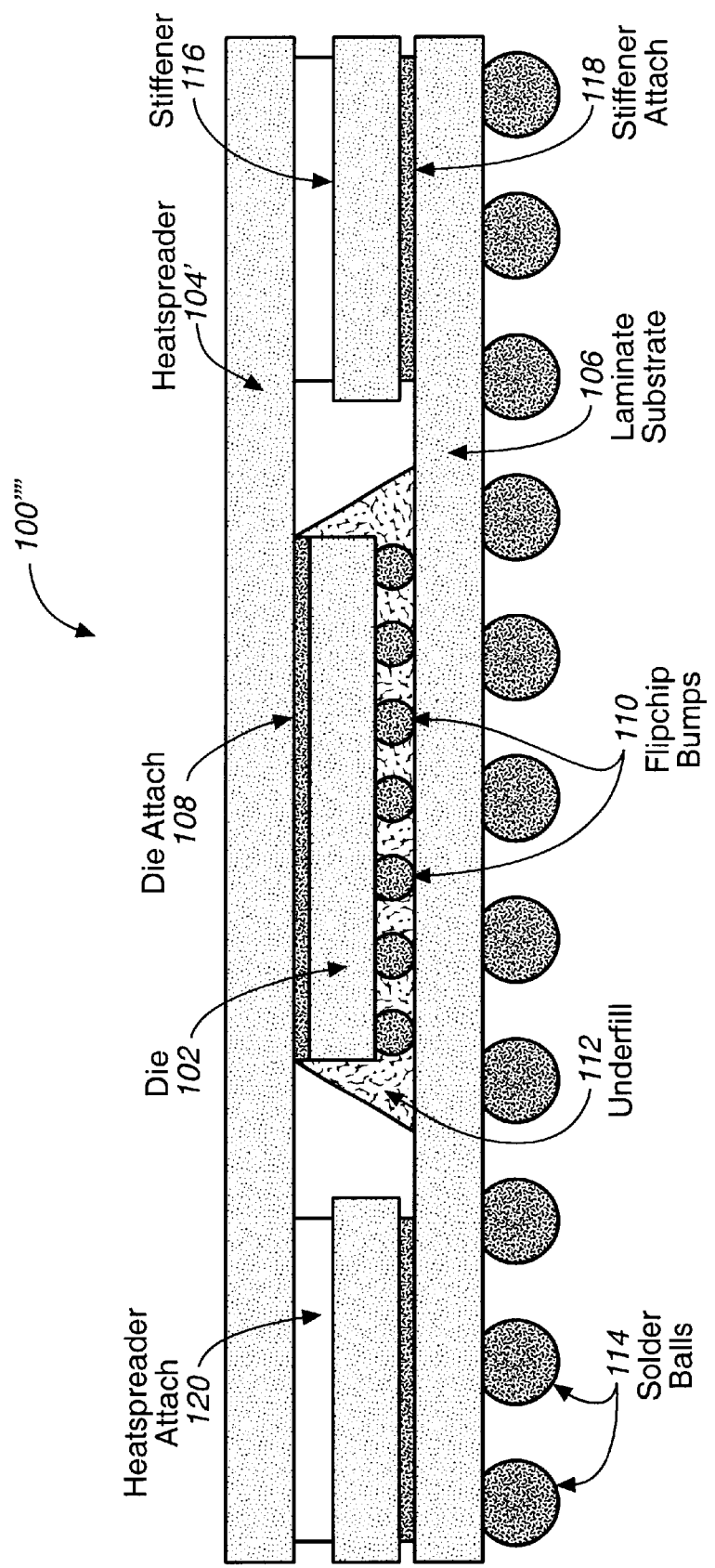
FIG._6

ENHANCED LAMINATE FLIPCHIP PACKAGE USING A HIGH CTE HEATSPREADER

FIELD OF THE INVENTION

The present invention relates to a method and/or architecture for providing flipchip packaging generally and, more particularly, to an enhanced laminate flipchip package using a heatspreader with a high coefficient of thermal expansion (CTE).

BACKGROUND OF THE INVENTION

Flipchip interconnect technology supports an "area array interconnect," in which a die (circuit) is mechanically and electrically connected through an array of solder bumps on the active face of the circuit. The flipchip technique increases the number of connections that can be made for a given die size and can also improve electrical performance. The die is attached to the substrate face down and can be reinforced with an epoxy underfill.

Referring to FIG. 1, a conventional laminate flipchip package 10 is shown. The flipchip package 10 includes a silicon die 12 attached to a laminate substrate 14 using flipchip solder bumps 16. A gap between the die 12 and the substrate 14 is filled with an underfill 18. A stiffener 20 is attached to the substrate 14 using a high modulus epoxy material 22 to flatten the substrate 14. A heatspreader 24 is attached to (i) the die 12 using a thermally conductive low modulus material 26 such as thermal grease and (ii) the stiffener 20 using a high modulus epoxy material 28. The substrate 14 has solder balls 30 on the side opposite the die 12.

Component and board level reliability of conventional laminate flipchip packages can be a major concern. The die 12 can have a coefficient of thermal expansion (CTE) of approximately 3 ppm/° C. The laminate substrate 14 can have a CTE of approximately 17 ppm/° C. Because of the difference in expansion between the die 12 and the substrate 14 (i.e., the mismatched CTEs), the solder bumps 16 can fatigue and cause failure. To prevent fatigue of the solder bumps 16, the conventional flipchip package 10 uses a high modulus underfill material 18 (i.e., a modulus in the range of 3 to 10 GPa).

In addition, a mismatch between the CTE of the die 12 and the CTE of the substrate 14 can warp the silicon die 12 causing tensile stress on the back side (non-active side) of the silicon die 12. Tensile stress on the die 12 can lead to cracks in the silicon die 12 during processing and reliability testing. The warpage of the die 12 can contribute significantly to the overall warpage of the package 10. Excess warpage in the region of the substrate 14 attached to the die 12 can cause cracks in the substrate 14 during stress testing. The stiffener 20 is needed to prevent excess warpage of the package 10. Stress generated at the interface between the die 12 and the underfill material 18 due to the CTE mismatch can cause delamination of the underfill material 18 from the die 12. The board level reliability of solder joints formed by the solder balls 30 can be compromised due to a CTE mismatch between the package 10 and the printed circuit board (PCB).

It would be desirable to have a laminate flipchip package that reduces and/or eliminates the component and board level reliability problems due to die and substrate CTE mismatch.

SUMMARY OF THE INVENTION

The present invention concerns a flipchip packaged integrated circuit comprising a substrate, a die and a heatspreader. The die may be configured to electrically attach to the substrate. The heat spreader may be rigidly attached to the die. The die and the heatspreader may have a combined coefficient of thermal expansion when attached. The heatspreader may be configured to match the combined coefficient of thermal expansion and a coefficient of thermal expansion of the substrate.

The objects, features and advantages of the present invention include providing a method and/or architecture for an enhanced laminate flipchip package using a high CTE heatspreader that may (i) match the coefficient of thermal expansion (CTE) of the die and heatspreader combination and the CTE of the substrate, (ii) reduce or eliminate underfill material, (iii) reduce or eliminate die cracks, (iv) place the back side of the die in compression, (v) reduce or eliminate substrate warpage in the die region, (vi) reduce or eliminate substrate cracking due to excess warpage in the die region, (vii) make use of an optional stiffener, (viii) reduce stress at the die/underfill interface, (ix) increase the board level reliability of solder joints under the die, and/or (x) increase the component and board level reliability of the flipchip package.

BRIEF DESCRIPTION OF THE DRAWINGS

These and other objects, features and advantages of the present invention will be apparent from the following detailed description and the appended claims and drawings in which:

FIG. 5 is a cross-sectional diagram of another alternate embodiment of the present invention; and FIG. 6 is a cross-sectional diagram of another alternate embodiment of the present invention.

DETAILED DESCRIPTION OF THE PREFERRED EMBODIMENTS

Figure 1:
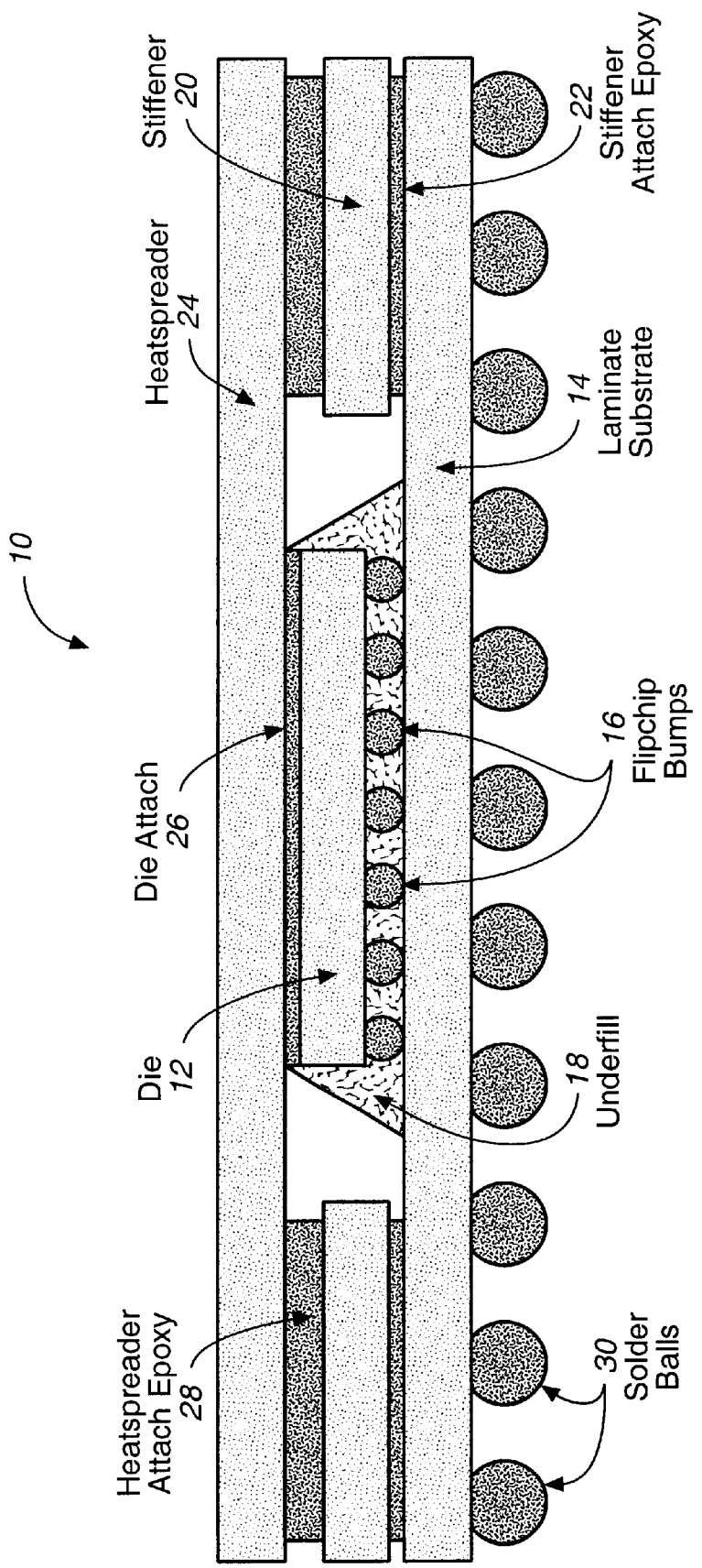
FIG. 1 is a cross-sectional diagram of a conventional laminate board package.
Figure 2:
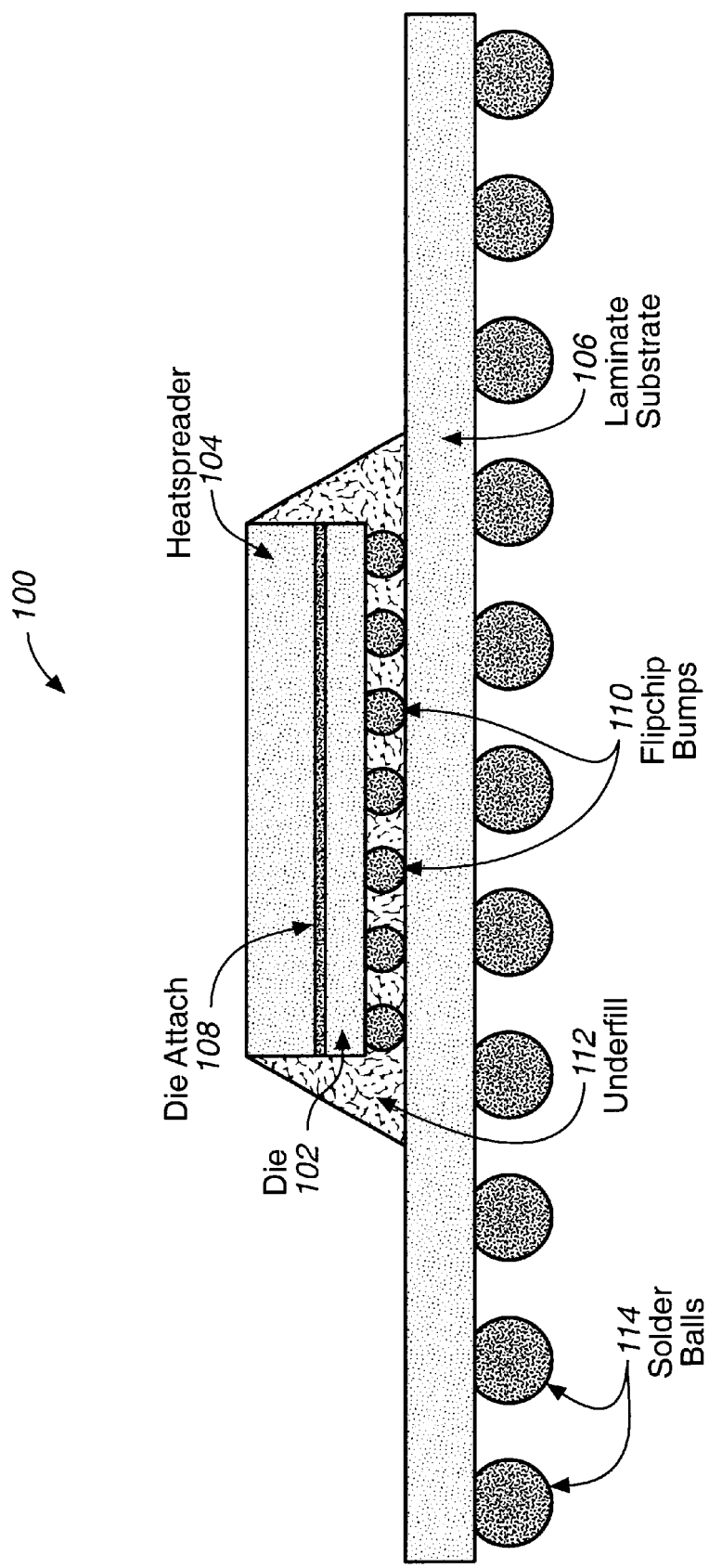
FIG. 2 is a cross-sectional diagram of a preferred embodiment of the present invention.

Referring to FIG. 2, a cross-sectional diagram of a package 100 is shown in accordance with a preferred embodiment of the present invention. The package 100 may be implemented as an enhanced laminate flipchip package using a heatspreader with a high coefficient of thermal expansion (CTE). The package 100 generally comprises a die 102, a heatspreader 104, and a substrate 106. The die 102 and the heatspreader 104 may be joined using a die attachment material 108 at any stage during an assembly process. In one example, the modulus of the die attachment material 108 may be greater than 100 MPa. The coefficient of thermal expansion (CTE) of the die 102 and the heatspreader 104 combination may be adjusted to match the CTE of the substrate 106.

The die 102 may be implemented as a silicon die. However, other materials (e.g., germanium, etc.) may be implemented accordingly to meet the design requirements of a particular application. The heatspreader 104 may be implemented using a metallic material (e.g., aluminum). In one example, the heatspreader 104 may be implemented as a heat sink. However, other configurations may be implemented accordingly to meet the design criteria of a particular application. The heatspreader 104 may be coated (e.g., oxide coated, painted, etc.) or uncoated. The die 102 may have a CTE that is lower than a CTE of the substrate 106. The heatspreader 104 generally has a CTE that is greater than a CTE of the substrate 106.

The die attachment material 108 may be implemented as a high modulus, high glass transition temperature (Tg) adherent (e.g., an epoxy, a metal alloy, etc.). The die attachment material 108 may be configured to rigidly join the die 102 to the heatspreader 104. The side of the die 102 that is attached to the heatspreader 104 may be in compression. Attaching the die 102 to the heatspreader 104 using the die attachment 108 may reduce the tendency of the die 102 to crack.

The die 102 may be mounted on the laminate substrate 106 via a plurality of flipchip solder bumps 110. The solder bumps 110 may be configured to provide an area array interconnect such that the die 102 is mechanically and electrically connected to the substrate 106. Optionally, an underfill 112 may be implemented to fill a gap between the die 102 and the substrate 106. The present invention may allow the use of any appropriate underfill material. The substrate 106 generally comprises a plurality of solder balls 114 on a side opposite the side where the die 102 is attached.

The CTE of the die 102 is generally lower than the CTE of the substrate 106. The heatspreader 104 generally has a CTE that is greater than the CTE of the substrate 106. One or more characteristics of the heatspreader 104 may be adjusted to provide an effective CTE of the combination of the die 102 and the heatspreader 104 substantially the same as (matches) the CTE of the substrate 106. In one example, a thickness of the heatspreader 104 may be adjusted to match the CTE of the die 102/heatspreader 104 combination with the CTE of the substrate 106. When the die (or wafer) 102 thickness is decreased, the thickness of the heatspreader 104 may be reduced. Similarly, in the example where the heatspreader 104 is implemented as a heat sink, thinning the die 102 may reduce the depth and/or number and/or change the shape of ribs on the heatspreader 104 required such that the CTE of the die 102/heatspreader 104 combination matches the CTE of the substrate 106. In another example, an area of the heatspreader 104 may be adjusted such that the CTE of the die 102/heatspreader 104 combination matches the CTE of the substrate 106. In one example, the area of the heatspreader 104 may be sized smaller than or equal to the area of the die 102.

Figure 3:
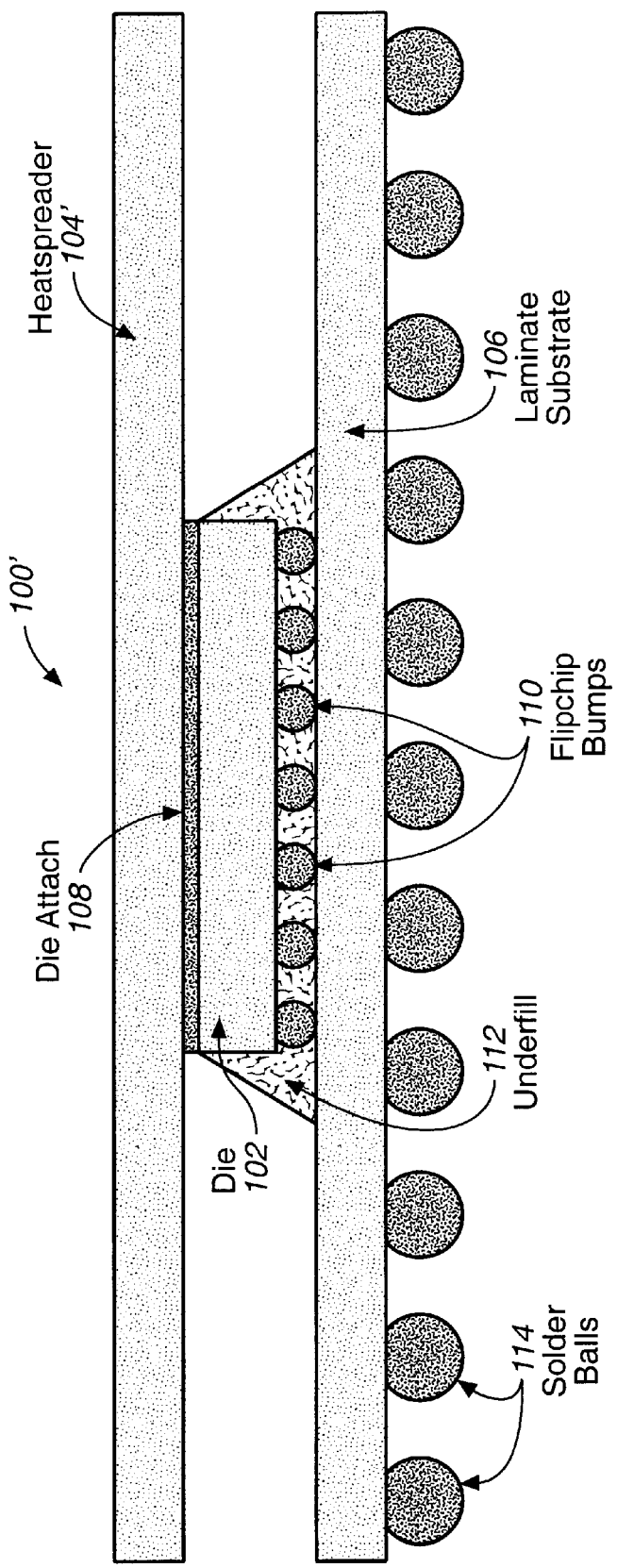
FIG. 3 is a cross-sectional diagram of an alternate embodiment of the present invention.

Referring to FIG. 3, a cross-sectional diagram of a package 100' illustrating an alternative implementation of the package 100 is shown. The package 100' may be implemented similarly to the package 100. The area of heatspreader 104' may be sized greater than the area of the die 102. In one example, the heatspreader 104' may be implemented as a heat sink. However, other configurations may be implemented accordingly to meet the design criteria of a particular application.

Figure 4:
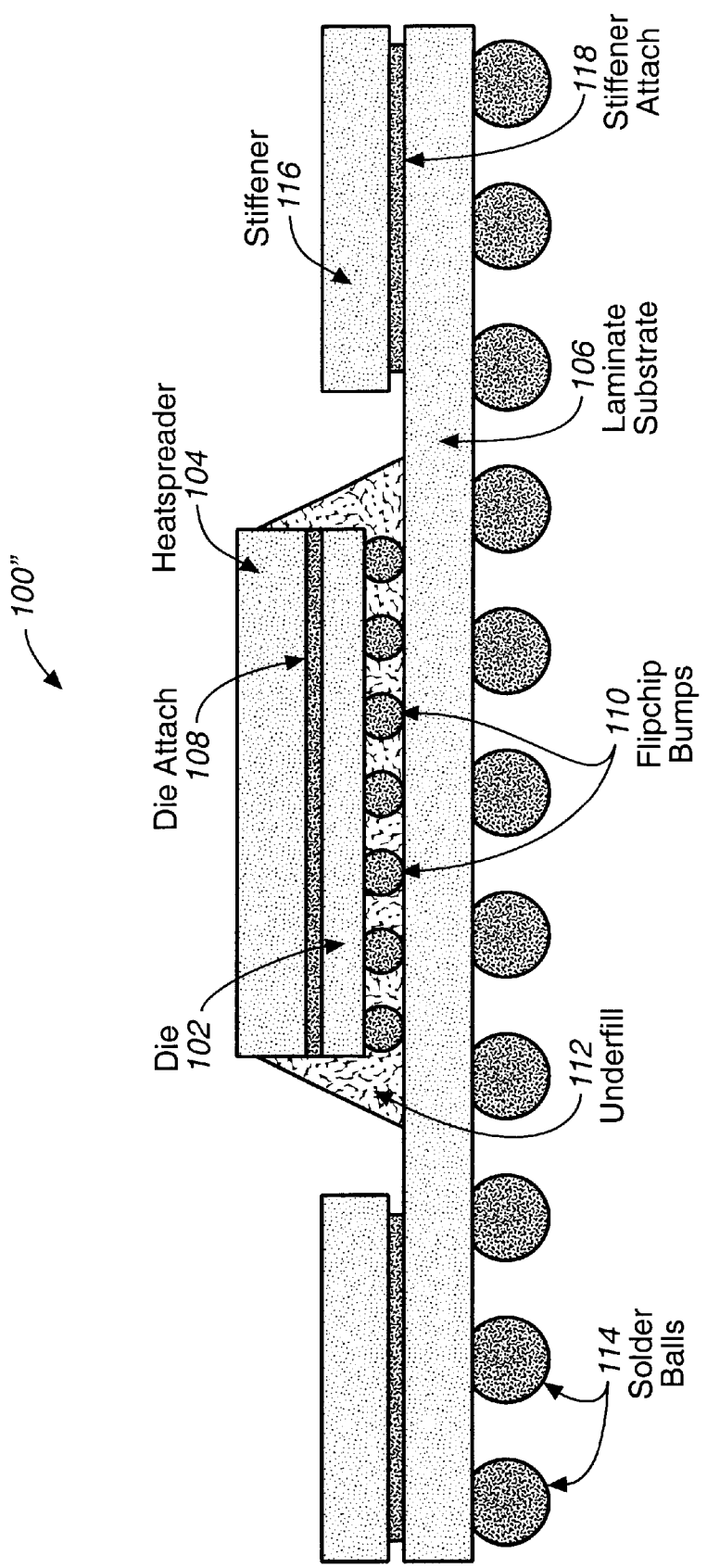
FIG. 4 is a cross-sectional diagram of another alternate embodiment of the present invention.

Referring to FIG. 4, a cross-sectional diagram of a package 100" illustrating another alternative implementation of the package 100 is shown. The package 100" may be implemented similarly to the package 100. The package 100" may comprise a stiffener 116. The stiffener 116 may be joined to the substrate 106 using a stiffener attachment 118. The stiffener 116 may have a CTE similar to the CTE of the substrate 106. The stiffener attachment 118 may be a high modulus, high Tg adherent similar to the die attachment 108. In one example, the modulus of the stifffener attachment 118 may be greater than 1 GPa.

Referring to FIG. 5, a cross-sectional diagram of a package 100''' illustrating yet another alternative implementation of the package 100 is shown. The package 100''' may be implemented similarly to the package 100" except that the package 100''' may comprise the heatspreader 104' (e.g., the area of heatspreader 104' may be sized greater than the area of the die 102). In general, the heatspreader 104' may be unattached to the stiffener 116. In one example, the heatspreader 104' may be implemented as a heat sink. However, other configurations may be implemented accordingly to meet the design criteria of a particular application.

Referring to FIG. 6, a detailed sectional diagram of a package 100'''' illustrating still another alternative implementation of the package 100 is shown. The package 100'''' may be implemented similarly to the package 100''' except that the heatspreader 104' may be joined to the stiffener 116 using a heatspreader attachment 120. The heatspreader attachment 120 may be implemented as a low modulus material (e.g., thermal grease, gel, etc.). The modulus of the heatspreader attachment 120 is generally less than 100 MPa.

The flipchip package 100 may have improved component and board level reliability when compared with conventional flipchip packages. The present invention may improve component and board level reliability of flipchip packages with laminate substrates. The present invention may match the effective CTE of the combination of a die and a heatspreader to the CTE of a laminate substrate. The present invention may reduce or eliminate warpage of the die 102. The present invention may reduce (a) cracking of the die 102 due to warpage and (b) cracking the substrate 106 due to (i) warpage of the die 102 and/or (ii) warpage of the substrate 106. The board level reliability of the solder joints between the package 100 and the printed circuit board (PCB) may be significantly increased.

The present invention may reduce or eliminate the underfill 112. When the underfill 112 is present, the present invention may significantly reduce stress at the interface between the die 102 and the underfill 112. The present invention may allow the stiffener 116 to have a reduced area and/or thickness or be eliminated.

While the invention has been particularly shown and described with reference to the preferred embodiments thereof, it will be understood by those skilled in the art that various changes in form and details may be made without departing from the spirit and scope of the invention.

What is claimed is:

1. A flipchip packaged integrated circuit comprising:
   a substrate;
   a die configured to electrically attach to said substrate; and
   a heat spreader (i) having a coefficient of thermal expansion (CTE) greater than a CTE of said substrate and (ii) rigidly attached to said die, said die and said heatspreader having a combined CTE when attached, wherein said heatspreader is adjusted to match said combined CTE to said CTE of said substrate.

2. The package according to claim 1, wherein said die (i) has a CTE lower than said substrate CTE and (ii) is attached to said heatspreader by a high modulus adherent.

3. The package according to claim 2, wherein said adherent comprises a high glass transition temperature epoxy.

4. The package according to claim 2, wherein said adherent comprises a metal alloy.

5. The package according to claim 1, wherein said heatspreader has an area the same as or smaller than an area of said die.

6. The package according to claim 1, wherein said heatspreader has an area greater than an area of said die.

7. The package according to claim 1, wherein said heatspreader comprises a metal heatspreader.

8. The package according to claim 7, wherein said metal comprises aluminum.

9. The package according to claim 1, wherein said heatspreader comprises a heat sink.

10. The package according to claim 1, wherein said package further comprises a stiffener joined to said substrate using a high modulus adherent.

11. The package according to claim 10, wherein said stiffener (i) has a CTE similar to said substrate CTE and (ii) is joined to said heatspreader using a low modulus adherent.

12. The package according to claim 11, wherein said low modulus adherent comprises a material selected from the group consisting of thermal grease and gel.

13. An apparatus comprising:

a substrate;

a die configured to electrically attach to said substrate;

an area array interconnect of solder bumps configured to mechanically and electrically connect said die to said substrate; and a heat spreader (i) having a coefficient of thermal expansion (CTE) greater than a CTE of said substrate and (ii) rigidly attached to said die, said die and said heatspreader having a combined CTE when attached, wherein said heatspreader is adjusted to match said combined CTE to said CTE of said substrate.

14. A method for providing mechanical and electrical connection to a die comprising the steps of:

(A) attaching said die to a substrate; and (B) rigidly attaching said die to a heat spreader having a coefficient of thermal expansion (CTE) greater than a CTE of said substrate, wherein (i) one or more physical characteristics of said heatspreader are adjusted to provide a combined CTE when attached to said die and (ii) said combined CTE matches said CTE of said substrate.

15. The method according to claim 14, wherein said die (i) has a CTE lower than said substrate CTE and (ii) is attached to said heatspreader using a high modulus adherent.

16. The method according to claim 15, wherein said adherent comprises a high glass transition temperature epoxy.

17. The method according to claim 15, wherein said adherent comprises a metal alloy.

18. The method according to claim 14, wherein one of said one or more characteristics comprises an area of said heatspreader.

19. The method according to claim 14, wherein one of said one or more characteristics comprises a thickness of said heatspreader.

20. The method according to claim 14, wherein said heatspreader comprises a metal heatspreader.

* * * * *